United States Patent
Chen et al.

(10) Patent No.: US 8,941,166 B2
(45) Date of Patent: Jan. 27, 2015

(54) MULTIPLE PATTERNING METHOD

(75) Inventors: Shih-Hung Chen, Jhudong Township, Hsinchu County (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 576 days.

(21) Appl. No.: 12/981,121

(22) Filed: Dec. 29, 2010

(65) Prior Publication Data

US 2012/0168841 A1 Jul. 5, 2012

(51) Int. Cl.
*H01L 29/788* (2006.01)
*H01L 27/115* (2006.01)
*H01L 21/033* (2006.01)
*G03F 7/00* (2006.01)

(52) U.S. Cl.
CPC ...... *H01L 27/11565* (2013.01); *H01L 21/0337* (2013.01); *H01L 21/0338* (2013.01); *H01L 27/1157* (2013.01); *H01L 27/11573* (2013.01); *G03F 7/0035* (2013.01)
USPC .... 257/314; 257/692; 257/773; 257/E29.112; 257/E29.135; 257/E29.136

(58) Field of Classification Search
CPC ............ H01L 23/528; H01L 27/11565; H01L 27/1157; H01L 27/11573; G03F 7/70466
USPC .................... 257/48, 314, E21.206, E21.038, 257/E21.039, E21.314, 692, 773, E29.112, 257/E29.135, E29.136; 438/736, 694, 717, 438/947
See application file for complete search history.

(56) References Cited

U.S. PATENT DOCUMENTS

| | | | | |
|---|---|---|---|---|
| 6,063,688 A | * | 5/2000 | Doyle et al. | 438/424 |
| 7,495,294 B2 | * | 2/2009 | Higashitani | 257/390 |
| 2003/0025147 A1 | | 2/2003 | Nomoto et al. | |
| 2007/0215874 A1 | * | 9/2007 | Furukawa et al. | 257/48 |
| 2008/0006869 A1 | | 1/2008 | Kamigaichi et al. | |
| 2009/0261479 A1 | | 10/2009 | Hong | |
| 2010/0244269 A1 | * | 9/2010 | Kim | 257/773 |

OTHER PUBLICATIONS

Xie, P. et al.; Analysis of higher order pitch division for sub-32nm lithography; Proceedings of SPIE vol. 7274 71741Y; © 2009; 8 pages.
Wikipedia, Double Patterning, downloaded on Jul. 29, 2010, 14 pages.
Office Action from corresponding TW patent application No. 100103128; Jun. 28, 2013; 5 pp.

* cited by examiner

*Primary Examiner* — Ermias Woldegeorgis
(74) *Attorney, Agent, or Firm* — Yiding Wu; Haynes Beffel & Wolfeld LLP

(57) ABSTRACT

An integrated circuit memory comprises a set of lines each line having parallel X direction line portions in a first region and Y direction line portions in a second region. The second region is offset from the first region. The lengths of the X direction line portions are substantially longer than the lengths of the Y direction line portions. The X direction and Y direction line portions have respective first and second pitches with the second pitch being at least 3 times larger than the first pitch. Contact pickup areas are at the Y direction line portions. In some examples, the lines comprise word lines or bit lines. The memory can be created using multiple patterning methods to create lines of material and then the parallel X direction line portions and parallel Y direction line portions.

10 Claims, 18 Drawing Sheets

MULTIPLE PATTERNING METHOD

BACKGROUND OF THE INVENTION

1. Field of the Invention

The present invention relates to integration circuit fabrication, and more particularly to multiple patterning methods of fabricating integrated circuits by which access to the lines of material formed thereby is facilitated.

2. Description of Related Art

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density.

Increases in circuit density often are limited by the resolution of the available photolithographic equipment. The minimum size of features and spaces that a given piece of photolithographic equipment can produce is related to its resolution capacity.

The sum of the minimum feature width and minimum space width producible with a given piece of photolithographic equipment is the minimum pitch that the piece of equipment can produce. The minimum feature width can often times be approximately equal to the minimum space width, so the minimum pitch that can be produced with a given piece of photolithographic equipment is approximately equal to double the minimum feature width that it can produce.

One way to reduce the pitch of an integrated circuit device below that of the minimum pitch produced lithographically is through the use of double or quadruple patterning, sometimes referred to as multiple patterning herein. Through this method a single mask is typically used to create a series of parallel lines of material on the substrate. Different methods can then be used to transform each parallel line of material into multiple parallel lines of material. The various methods typically use a series of deposition and etching steps to do so. Different methods are discussed in Xie, Peng and Smith, Bruce W., "*Analysis of Higher-Order Pitch Division for Sub-32 nm Lithography*", Optical Microlithography XXII, Proc. of SPIE Vol. 7274, 72741Y, © 2009 SPIE. One method, discussed in the example below, uses self aligned sidewall spacers to create, typically, two or four parallel lines material for each line of material created from the original mask.

SUMMARY OF THE INVENTION

The present invention is based in part on the recognition of the problems created by reducing the pitch to sub lithographic dimensions. That is, while the pitch between the lines material may be sub lithographic, the requirements for accessing the lines, typically through an access element such as a vertical plugs, may not be completely compatible with the sub lithographic dimensions. The masks used to define plugs are lithographic in size, and allowances for misalignment of masks increases the required sizes for the access areas.

An example of an integrated circuit memory comprises a set of lines each line having parallel X direction line portions in a first region and Y direction line portions in a second region. The second region is offset from the first region. The lengths of the X direction line portions are substantially longer than the lengths of the Y direction line portions. The X direction and Y direction line portions have respective first and second pitches with the second pitch being at least 3 times larger than the first pitch. Contact pickup areas are at the Y direction line portions. In some examples, the lines are word lines or bit lines.

An example of a multiple patterning method for creating lines during photolithographic integrated circuit processing procedures is carried out as follows. A set of line patterns is selected for a set of first lines of material. A set of first lines of material is formed over a substrate. Each first line of material defines a pattern having an X direction portion and a Y direction portion. The lengths of the X direction portions of the first lines of material are substantially longer than the lengths of the Y direction portions of the first lines of material. First and second pitches are selected for the X direction and Y direction portions with the second pitch being larger than the first pitch. The X direction portions are parallel and the Y direction portions are parallel. At least two second lines of material are formed parallel to each first line of material to create word lines comprising parallel X direction line portions and parallel Y direction line portions. The Y direction line portions comprise end regions. Supplemental features are formed at least in part at the end regions. In some examples, the lines are word lines or bit lines. In some examples, at least parts of the Y direction line portions are removed to create the end regions for the lines. In some examples, the second pitch is at least four times the first pitch while in other examples the second pitch is at least eight times the first pitch. In some examples, forming supplemental features includes forming enlarged contact pickup areas.

Other features, aspects and advantages of the present invention can be seen on review of the drawings, the detailed description and the claims, which follow.

BRIEF DESCRIPTION OF THE DRAWINGS

FIG. 1 is a top plan view of nested, ring-like lines of material created within a substrate from correspondingly shaped masks, the lines of material having parallel X directed portions and parallel Y directed portions, the pitch between the X directed portions being smaller than the pitch between the Y directed portions.

FIG. 2 shows the creation of spacers on each side of the lines of material of FIG. 1 thereby doubling the line density with a subsequent decrease in the pitch.

FIG. 3 shows the creation of spacers on each side of the lines of material of FIG. 2 thereby quadrupling the line density from that of FIG. 1 with a subsequent decrease in the pitch.

FIG. 4 shows a top plan view of a mask to use with the structure of FIG. 3.

FIG. 5 shows alignment of the mask of FIG. 4 with the structure of FIG. 3 covering parts of the Y directed portions.

FIG. 6 show the result of removal of the parts of the Y directed portions covered by the mask of FIG. 4 creating end regions for the lines of material.

FIG. 7 is a plan view of a mask to be used with the structure of FIG. 6 to create supplemental features.

FIG. 8 shows results of using the mask of FIG. 7 and appropriate subsequent processing steps, such as exposing and etching, to create supplemental features, specifically contact pads at the end regions along the Y directed portions and bit lines or word lines.

DETAILED DESCRIPTION

Figure 1:
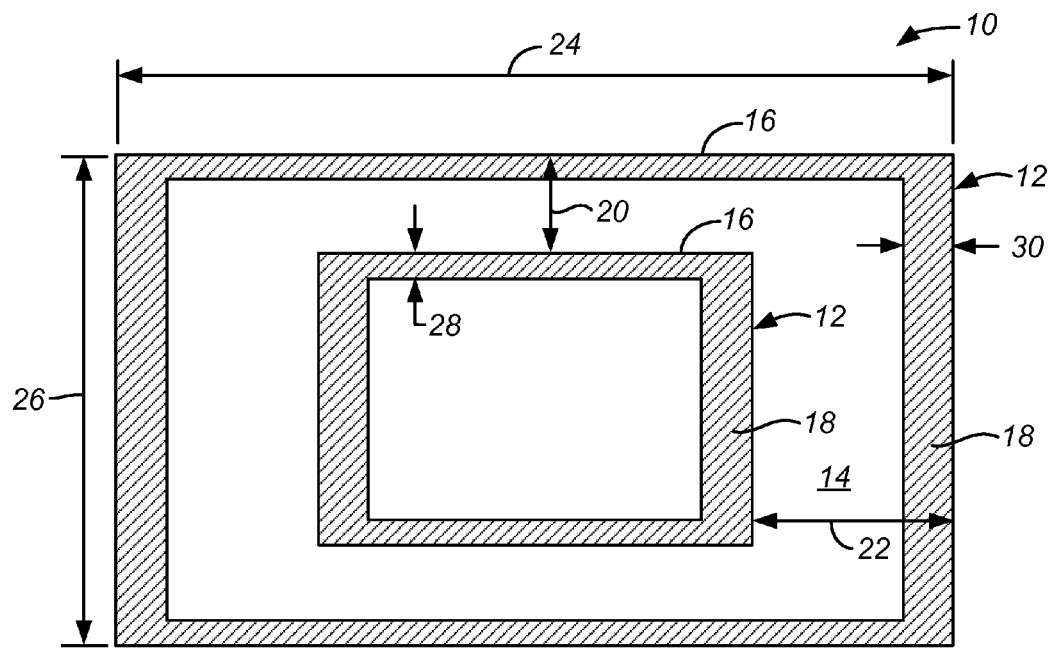
FIGS. 1-8 illustrate, in simplified form, a first example of a quadruple patterning process.

A detailed description of embodiments of the present invention is provided with reference to the FIGS. 1-33. It is to be understood and appreciated that the process steps and structures described herein do not describe a complete process flow for the manufacturing of an integrated circuit. The invention may be practiced in conjunction with various integrated circuit fabrication techniques that are conventionally used in the art, or that are hereafter developed.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments and examples are commonly referred to with like reference numerals.

FIGS. 1-8 illustrate, in simplified form, a first example of a quadruple patterning process incorporating the method of the present invention.

FIG. 1 is a top plan view of a set 10 of nested, ring-like first lines of material 12 created on a substrate 14 from correspondingly shaped masks. The first lines of material 12 have parallel X directed portions 16 and parallel Y directed portions 18. The pitch 20 between the X directed portions 16 is smaller than the pitch 22 between the Y directed portions 18. Pitch 20 is preferably no more than about 15% of pitch 22, and more preferably no more than about 25% of pitch 22. The lengths 24 of X directed portions 16 are substantially greater than the lengths 26 of Y directed portions 18, typically orders of magnitude greater. However, for purposes of illustration the lengths 24 of X directed portions 16 are not to scale but are greatly reduced. In this example, the width 28 of each X directed portion 16 can be, for example, about 30 nm and the width 30 of each Y directed portion 18 can be, for example, about 110 nm. This extra width for Y directed portion 18 can be accommodated because pitch 22 is greater than pitch 20.

Figure 2:
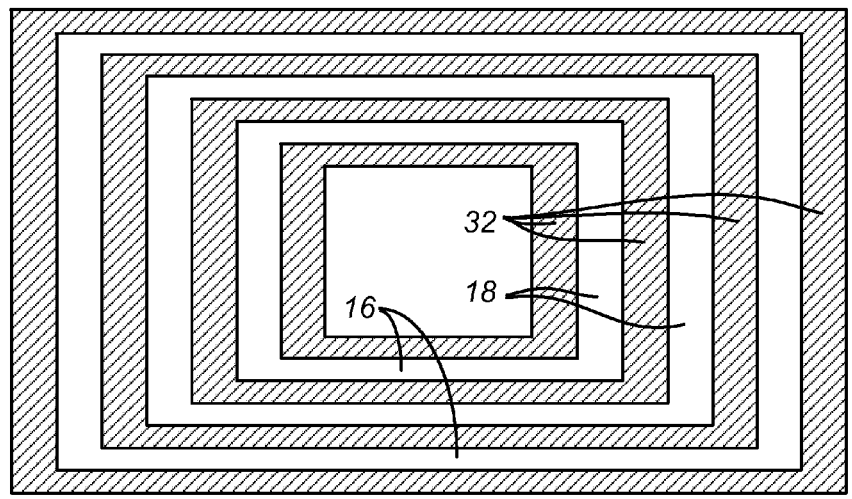

FIG. 2 shows the creation of spacers 32 on each side of the X directed portions 16 and Y directed portions 18 of the first lines of material 12 of FIG. 1. Spacers 32 act as a set of second lines of material 32. This effectively doubles the line density compared with the density of the first lines of material 12 with a consequent decrease in the pitch. In subsequent processing steps X directed portions 16 and Y directed portions 18 of the first lines of material 12 are removed leaving only spacers 32 as the second lines of material.

Figure 3:
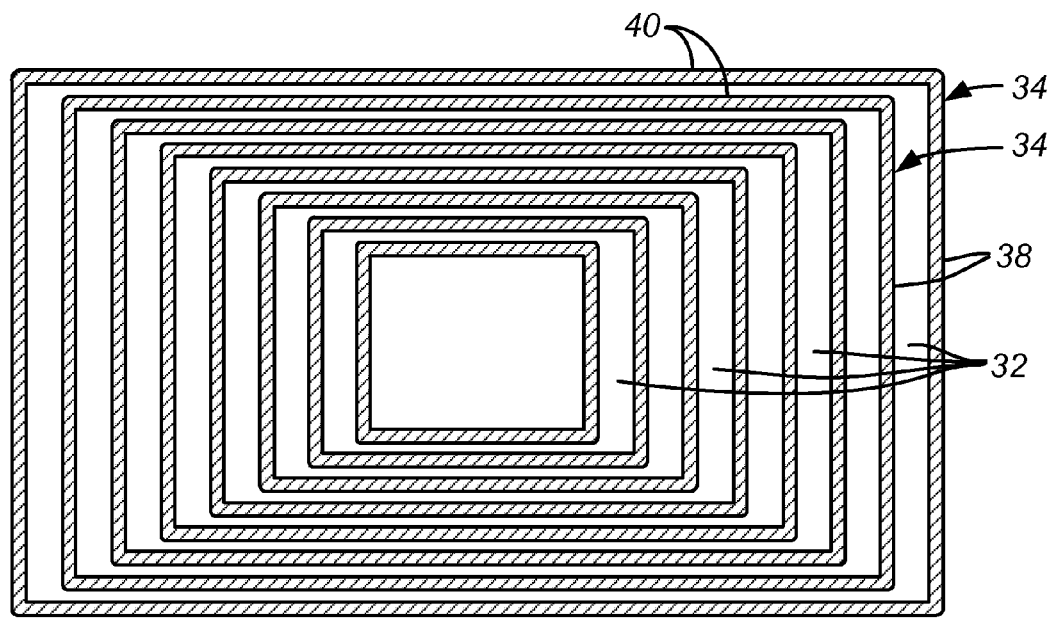

FIG. 3 shows the creation of spacers 34 on each side of the second lines of material 32 of FIG. 2 thereby quadrupling the line density from that of FIG. 1 with a consequent decrease in the pitch. As with portions 16 and 18, second lines of material 32 are removed during subsequent processing steps leaving only spacers 34 as the third lines of material 34.

Figure 4:
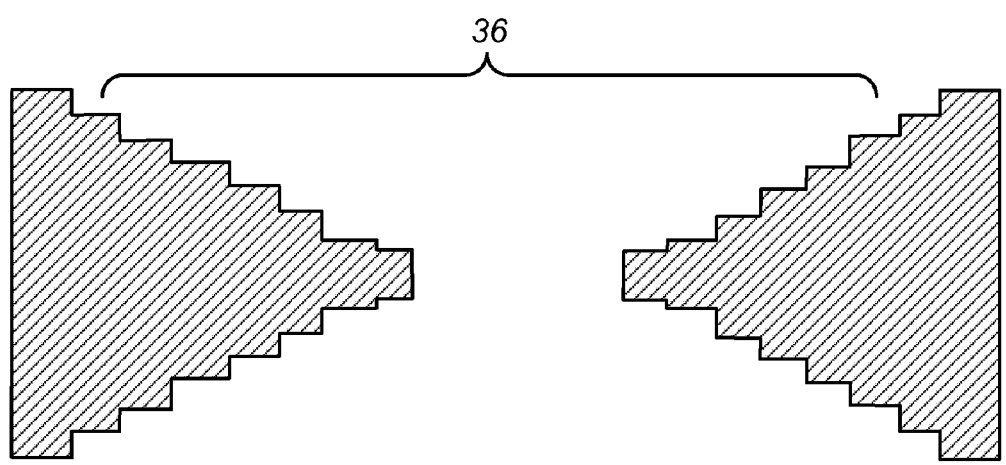
Figure 5:
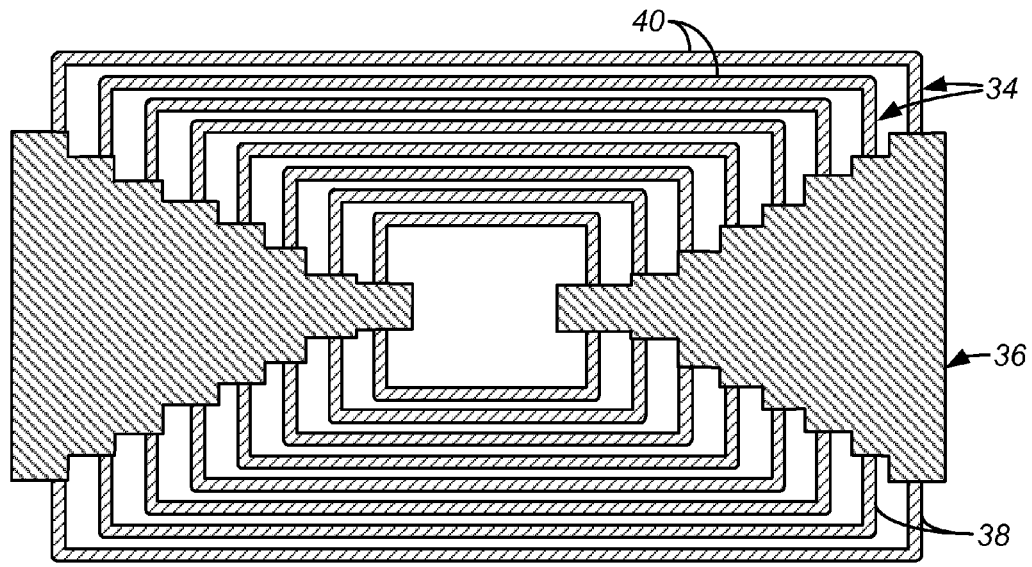

FIG. 4 is a top plan view of a mask 36 to use with the structure of FIG. 3. Mask 36 is used to mask off parts of the Y directed portions 38 of the spacers 34 of FIG. 3; in this example, X directed portions 40 are not modified using mask 36 as shown in FIG. 5. Using mask 36 permits the removal of parts of the Y directed portions 38 of spacers 34. The result of this removal, shown in FIG. 6, creates end regions 42 along the Y directed portions 38.

Figure 6:
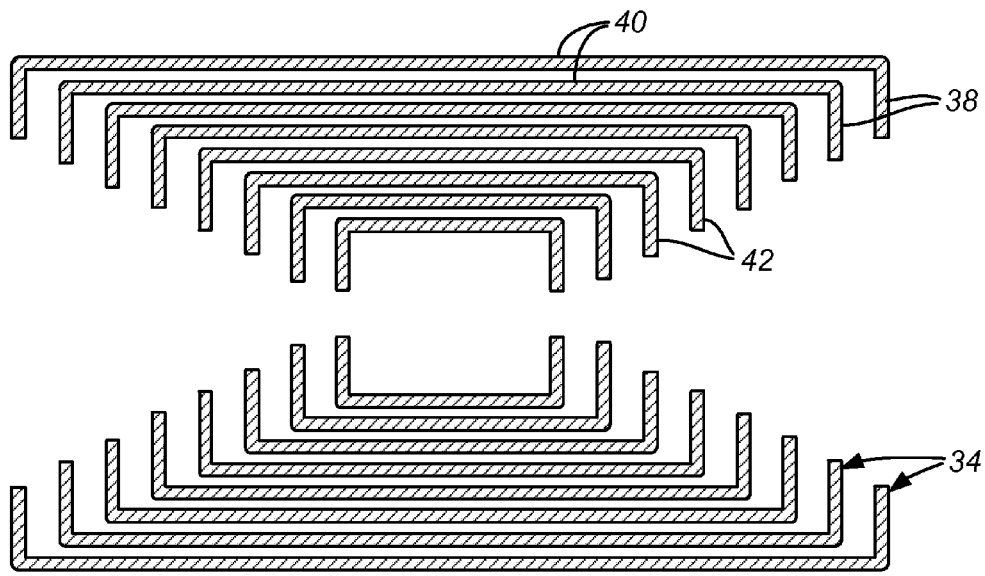
Figure 7:
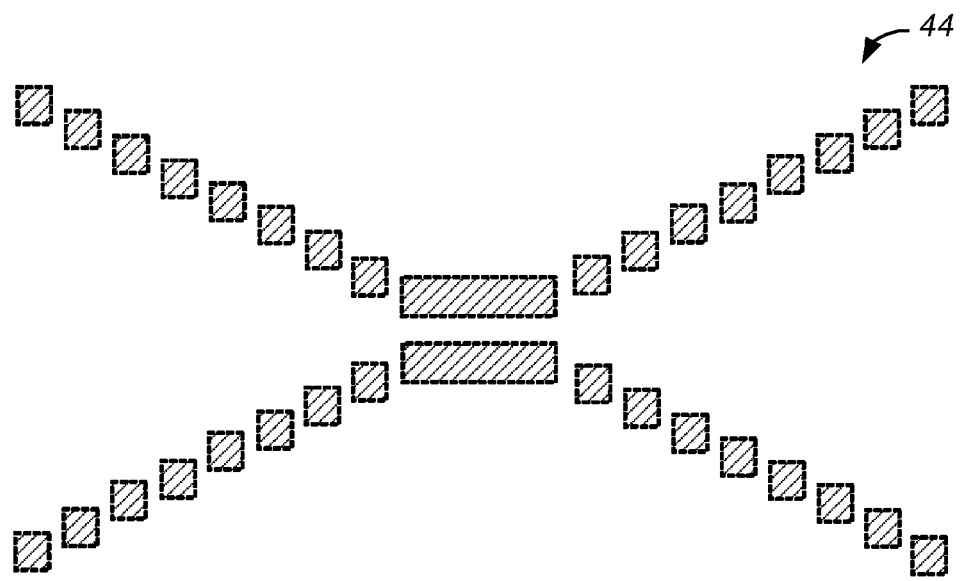
Figure 8:
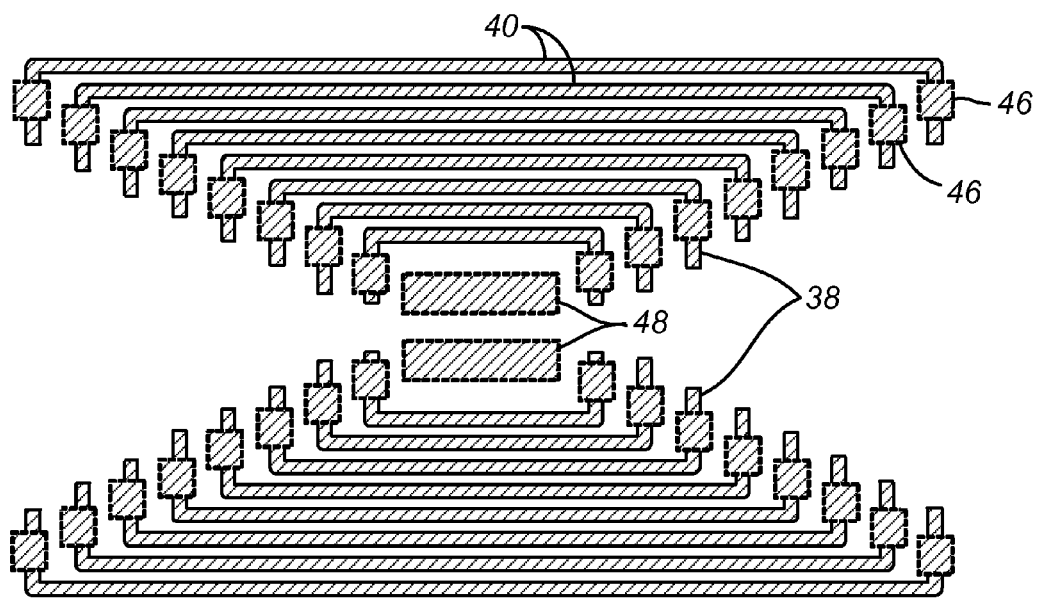
Figure 9:
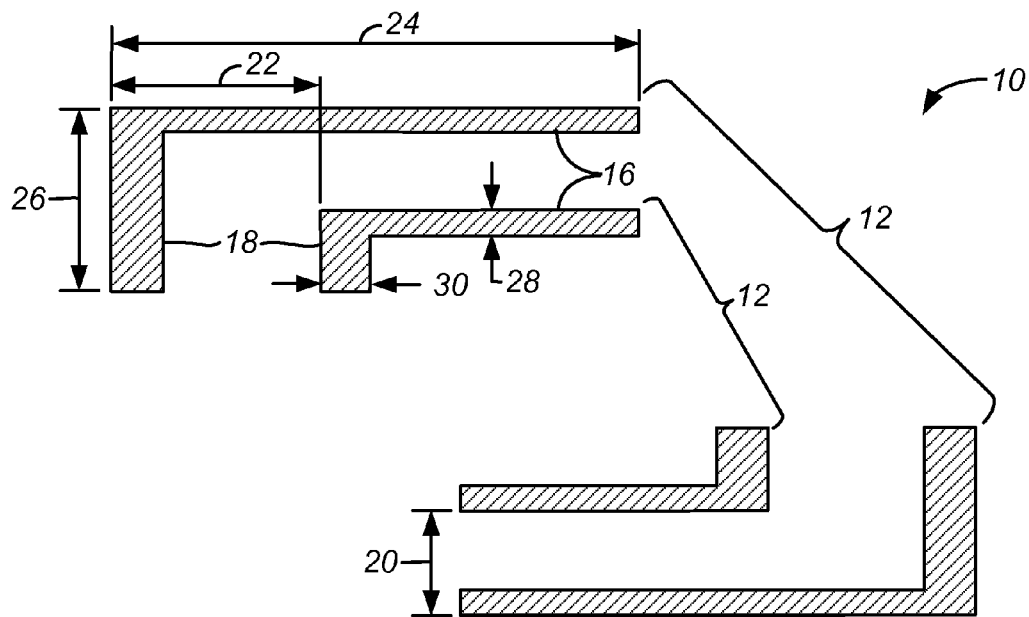
FIGS. 9-16 illustrate, in simplified form, a second example of a quadruple patterning process similar to that of FIGS. 1-8, but in which the nested, ring-like lines of material are in the form of L-shaped segments.
Figure 10:
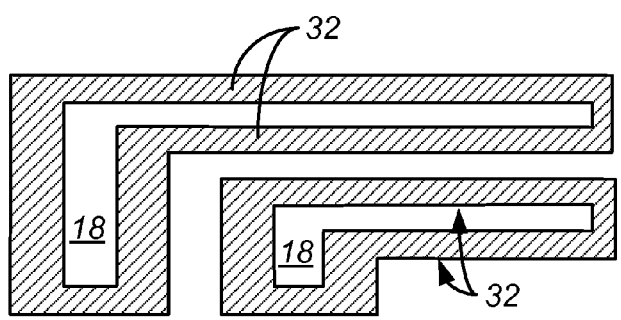
Figure 10:
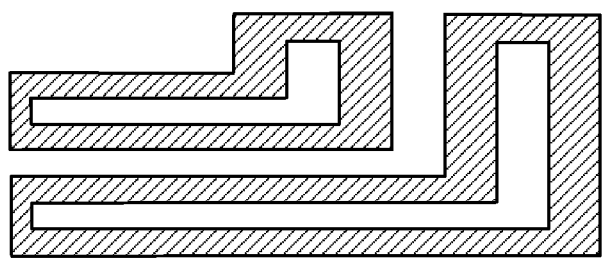
Figure 11:
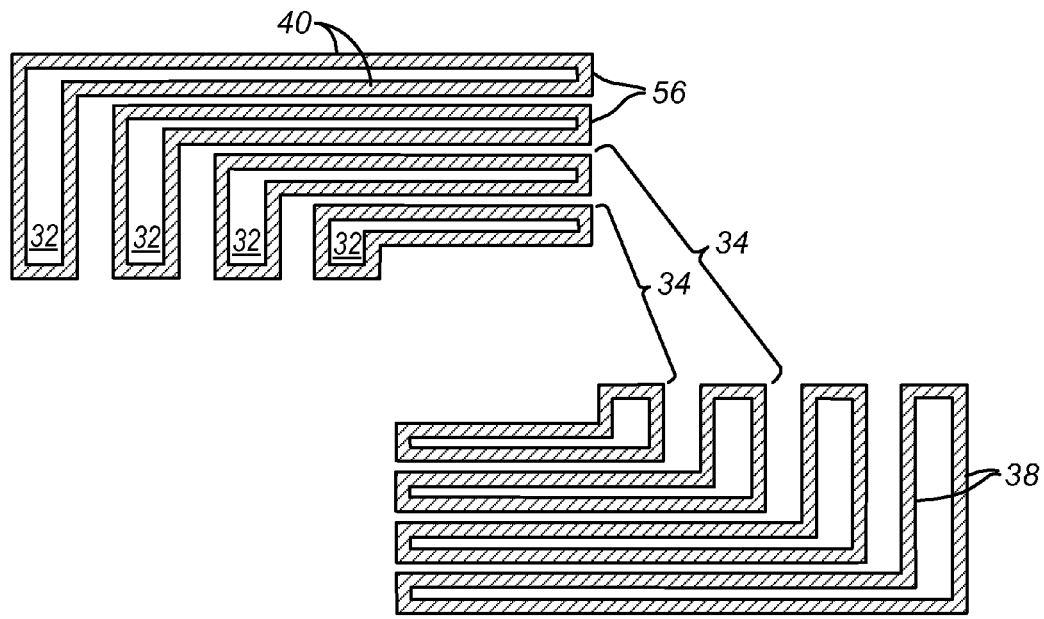

FIG. 7 is a plan view of a mask 44 to be used with the structure of FIG. 6 to create supplemental features. In this example, the supplemental features include contact pads, to be applied at end regions 42 of Y directed portions 38, and circuit interconnect lines. FIG. 8 shows results of using mask 44 and appropriate subsequent processing steps, such as exposing and etching steps, to create supplemental features, specifically contact pads 46 at the end regions 42 along the Y directed portions 38, and circuit interconnect lines 48. The pitch of Y directed portions 38 is preferably sufficient for lithographically sized pads and alignment tolerances while the pitch of the X directed portions 40 are not constrained by these issues and therefore can be sub lithographic.

The increased pitch between end regions 42 of Y directed portions 38, when compared to the pitch of X directed portions 40, is important because it can permit the use of conventional, lithographically sized contact pads 46 or larger pads formed in other ways to provide electrical access to the sub lithographically sized and spaced X directed portions 40 of the third lines of material 34. The third lines of material 34 typically act as word lines or bit lines so that X directed portions 40 and Y directed portions 38 are typically X directed word/bit line portions 40 and Y directed word/bit line portions 38, respectively. By providing sufficient space between the innermost X directed portions 40 of the lines of material 34, the circuit interconnect lines 48 can be placed between the innermost X directed portions as shown in FIG. 8. In other examples circuit interconnect lines 48 can be positioned outside of the outermost X directed portions 40 of the lines of material 34. Circuit interconnect lines 48 can be lithographically sized or sub lithographically sized lines.

Figure 12:
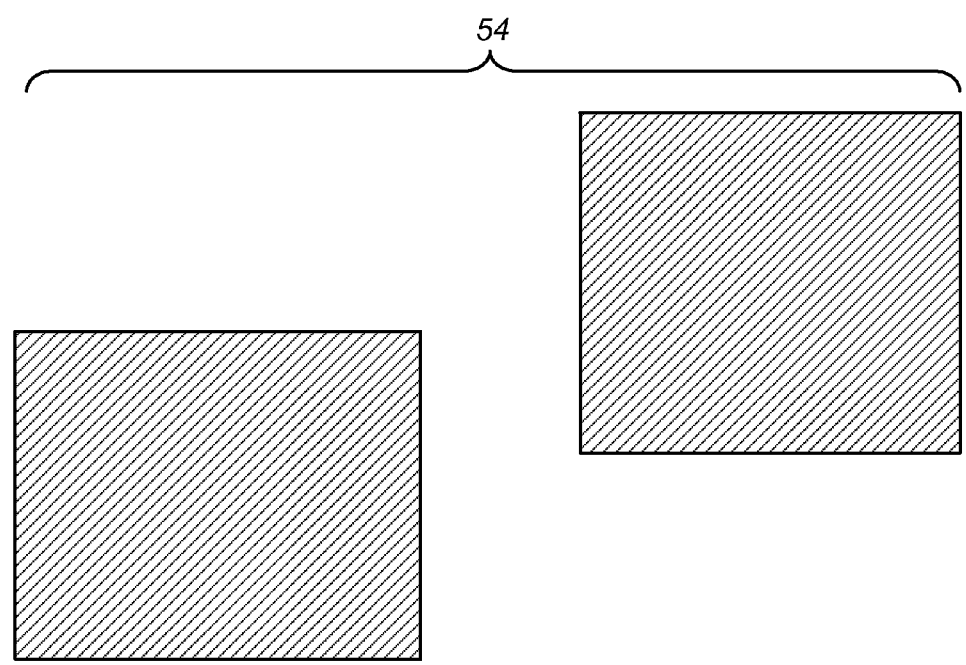
Figure 13:
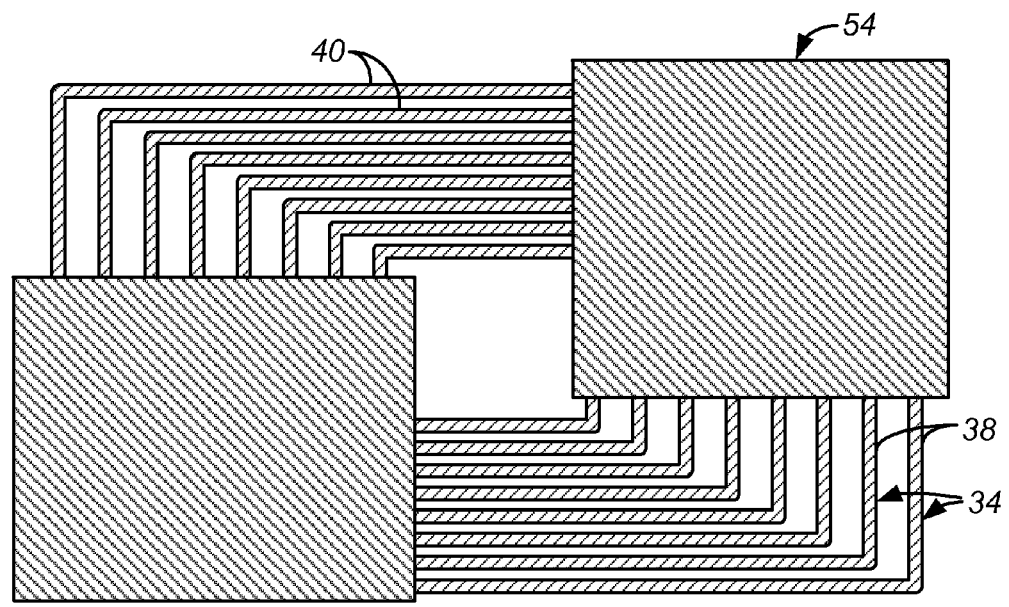
Figure 14:
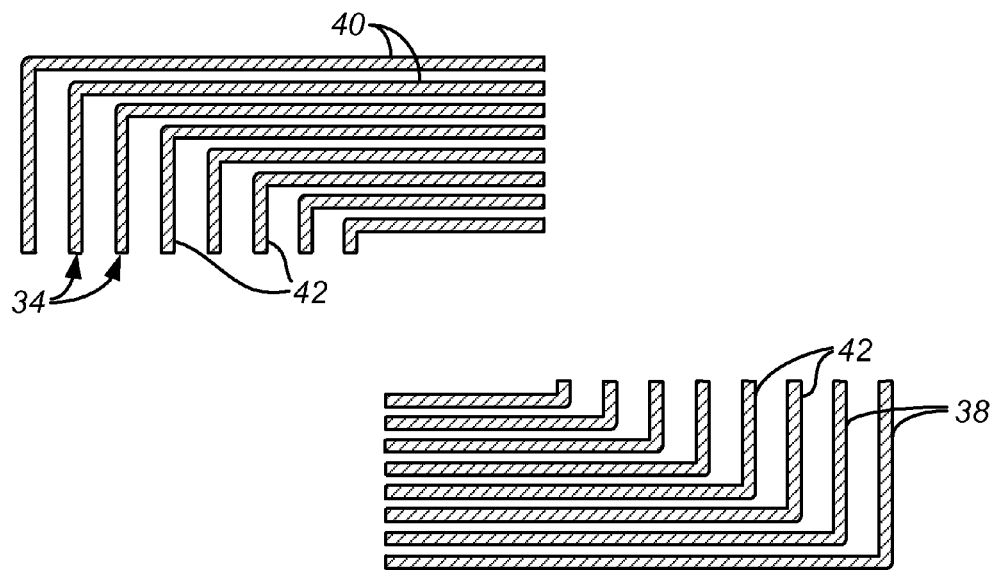
Figure 15:
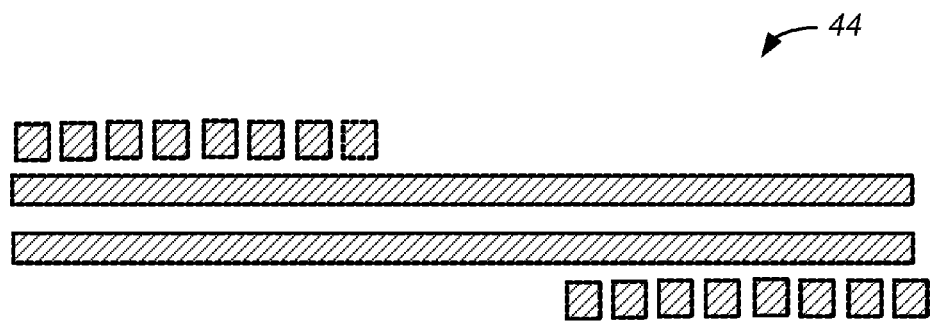
Figure 16:
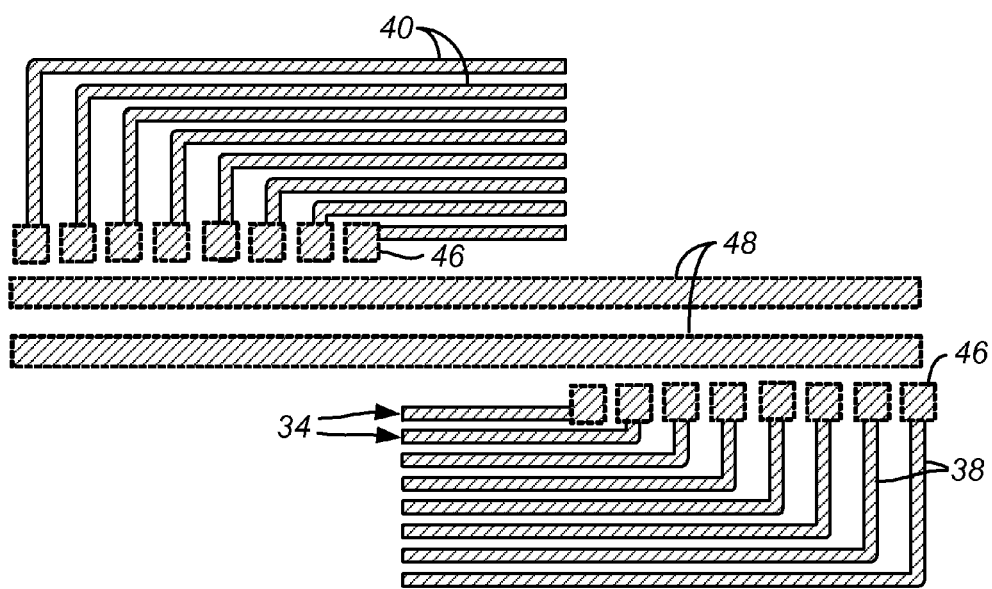

FIGS. 9-16 illustrate, in simplified form, a second example of a quadruple patterning process similar to that of FIGS. 1-8. Therefore, this second example will not be described in detail. However, the primary distinctions are as follows. The set 10 of nested, ring-like lines of material 12 are in the form of L-shaped segments 52. Therefore, pairs L-shaped segments 52 create the nested, ring like lines of material. Mask 54 of FIG. 12 is sized to cover not only parts of Y directed portions 38 but also parts of X directed portions 40, see FIG. 13, so that adjacent spacers 34 are not electrically connected to one another by the end elements 56 shown in FIG. 11.

Figure 17A:
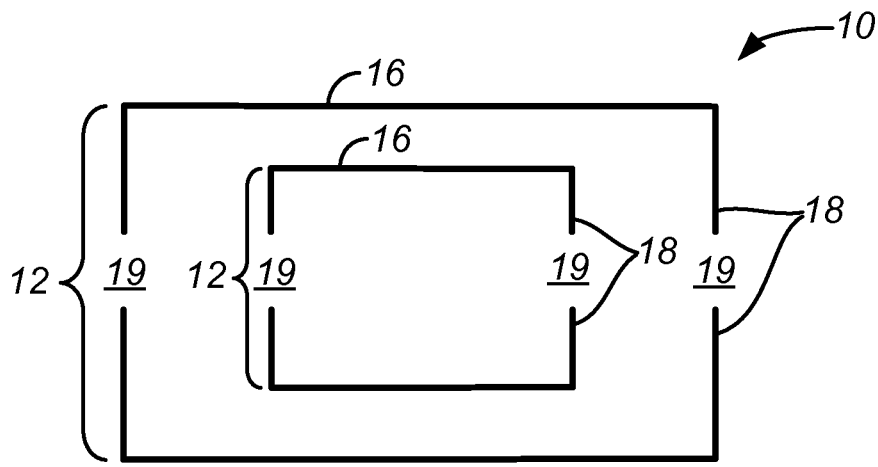
FIGS. 17A-17C show three additional examples of sets of nested, ring like lines of material.
Figure 17B:
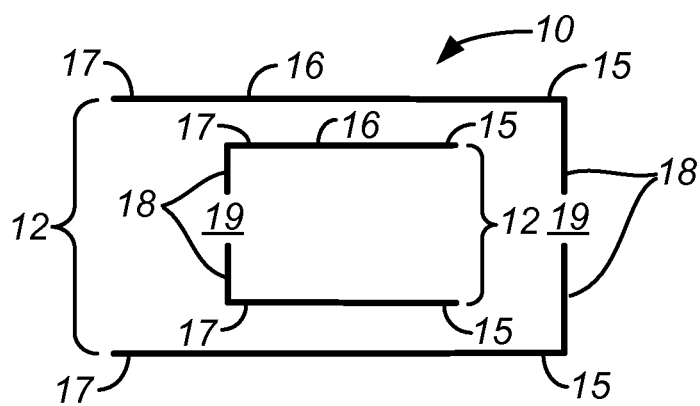
Figure 17C:
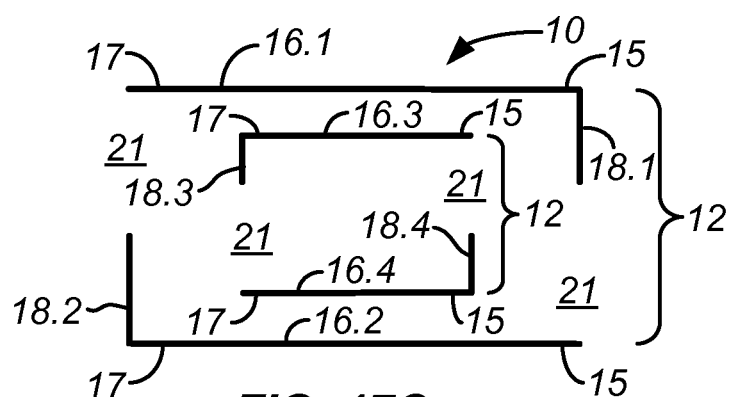

FIGS. 17A-17C show three additional examples of sets 10 of nested, ring like lines of material 12 with X directed portions 16 and Y directed portions 18. FIG. 17A illustrates an open ring configuration for the first lines of material 12 having opposed U-shaped segments with gaps 19 midway along the Y directed portions 18.

FIG. 17B shows another open ring configuration for the first lines of material 12 having opposed L-shaped segments also having gaps 19 midway along the Y directed portions 18. However, the Y directed portions 18 are at alternating ends of adjacent X directed portions 16. X directed portions 16 have first ends 15 and second ends 17. The Y directed portions 18 for the outer ring-like line of material 12 are at the first ends 15 while the Y directed portions 18 for the inner ring-like line of material 12 are at the second ends 17.

The example of FIG. 17C shows a variation of the open ring configuration of FIG. 17B example in which the Y directed portions 18 for the same first line of material 12 are at opposite ends 15, 17 of the X directed portions 16. This creates gaps 21 between the Y directed portions 18 and the ends 15, 17 of the opposite X directed portions 16. In this example, the outer line of material 12 has first and second X directed portions 16.1 and 16.2 and first and second Y directed portions 18.1 and 18.2. The first Y directed portion 18.1 is at the first end 15 of the first X directed portion 16.1. The second Y directed portion 18.2 is at the second end 17 of the second X directed portion 16.2. An inner ring-like line of material 12 comprises third and fourth X directed portions 16.3 and 16.4 and third and fourth Y directed portions 18.3 and 18.4. The third Y directed portion 18.3 is at the second end 17 of the third X directed portion 16.3, and the fourth Y directed portion 18.4 is at the first end 15 of the fourth X directed portion 16.4.

Figure 18:
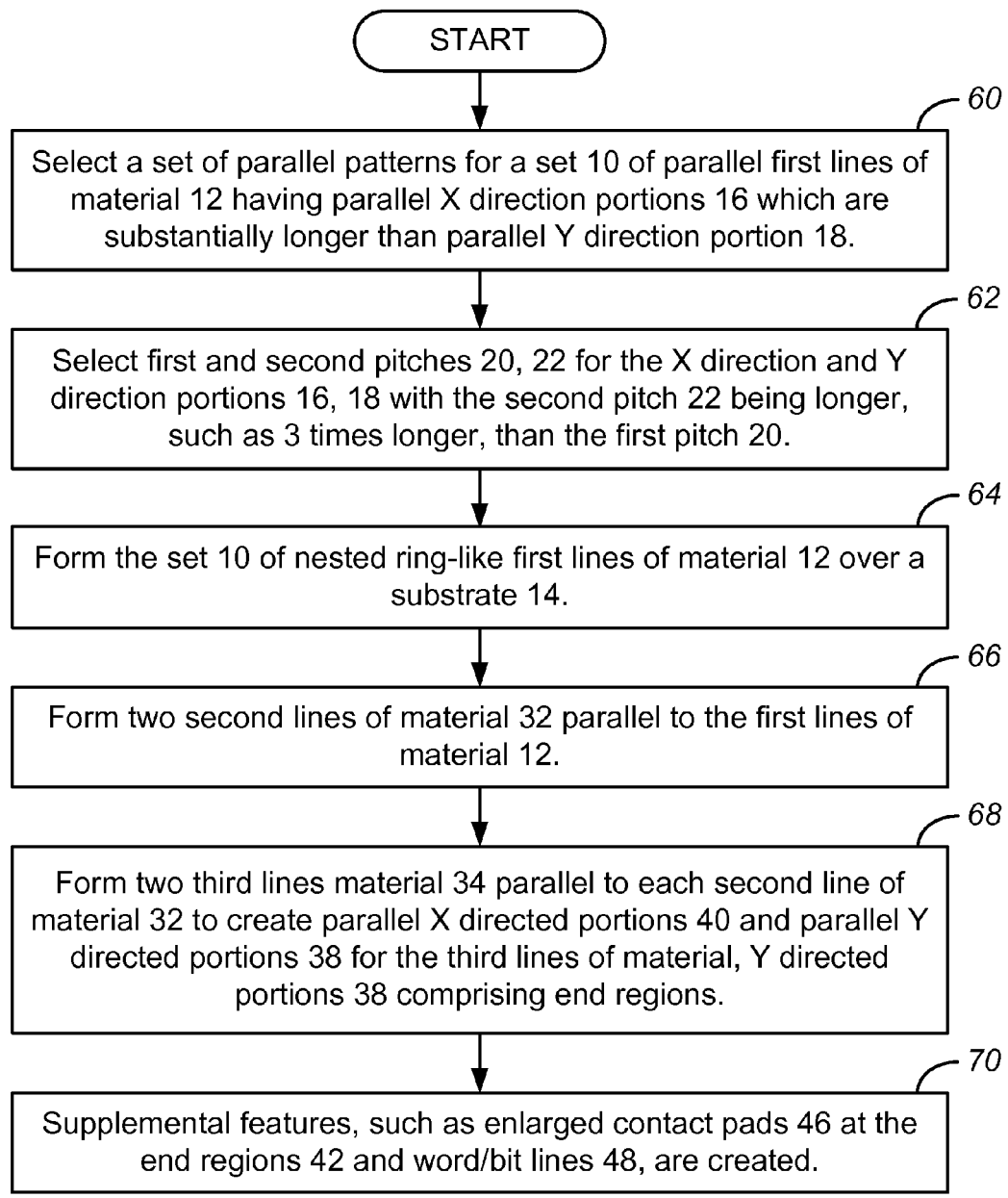
FIG. 18 is a simplified flow diagram showing the basic procedures carried out in the multiple patterning method of the present invention discussed above with reference to FIGS. 1-17.

FIG. 18 is a simplified flow diagram showing the basic procedures carried out in the multiple patterning method of the present invention. Starting at 68, a set of parallel line patterns, typically nested ring-like patterns, for a set 10 of parallel first lines of material 12 is selected. First lines of material 12 have parallel X direction portions 16 which can be substantially longer than parallel Y direction portions 18, such as 100 or 1000 times as long. Next, at 62, the first and second pitches 20, 22 for the X direction and Y direction portions 16, 18 are selected. The pitches are selected such that the second pitch 22 is larger, such as 4-8 times larger, than the first pitch 20. At 64 the set 10 of parallel first lines of material 12 is formed over a substrate 14. Two second lines of material 32 are formed at 66. The second lines of material 32 are parallel to the first lines of material 12. Two third lines material 34 are formed parallel to each second line of material 32 at 68. Doing so creates parallel X directed portions 40 and parallel Y directed portions 38 for the third lines of material. The Y directed portions 38 of the second lines of material 34 comprise end regions 42. At 70 supplemental features, such as enlarged contact pads 46 at the end regions 42 and circuit interconnect lines 48, are created.

Figure 19:
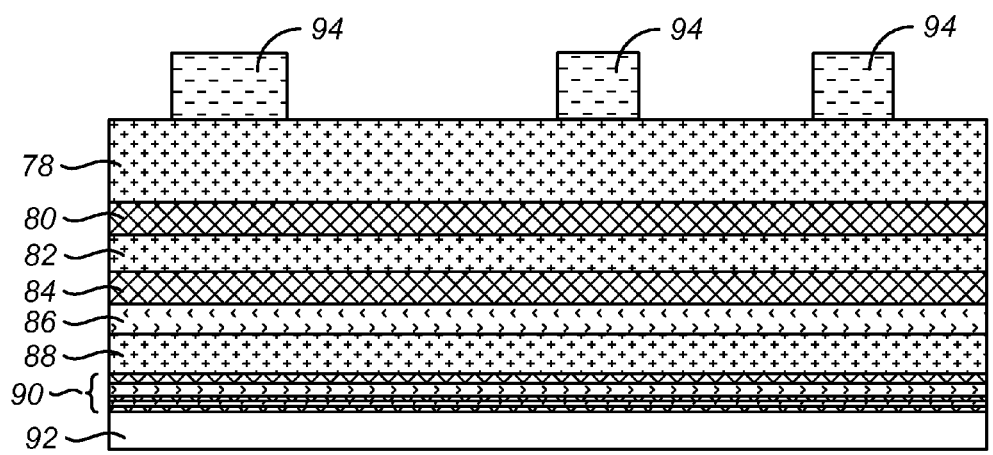
FIGS. 19-32 show the process flow for one example using BESNOS WL quadruple patterning.

FIGS. 19-32 show the process flow for one example using BE-SONOS WL quadruple, self-aligned spacer patterning, BE-SONOS referring to charge trapping memory cell. FIG. 19 shows a substrate 76 including first through eighth layers 78-92 and a photo resist trace 94 formed on first layer 78. In this example, first, third and sixth layers 78, 82 and 88 are made of polycrystalline silicon, commonly referred to as poly, while a second and fourth layers 80 and 84 are made of $SiO_2$. Sixth layer 86 is made of WSi. The eighth layer 92 is Si. The seventh layer 90 is a composite of five layers, acting as charge storage structure for BE-SONOS, having alternating $SiO_2$ and SiN layers with the $SiO_2$ layers being the first, third and fifth layers counting from the top. The first, second and third layers 78, 80 and 82 are considered sacrificial layers because they are completely removed in the patterning process. Other materials and arrangements of materials may also be used.

Figure 20:
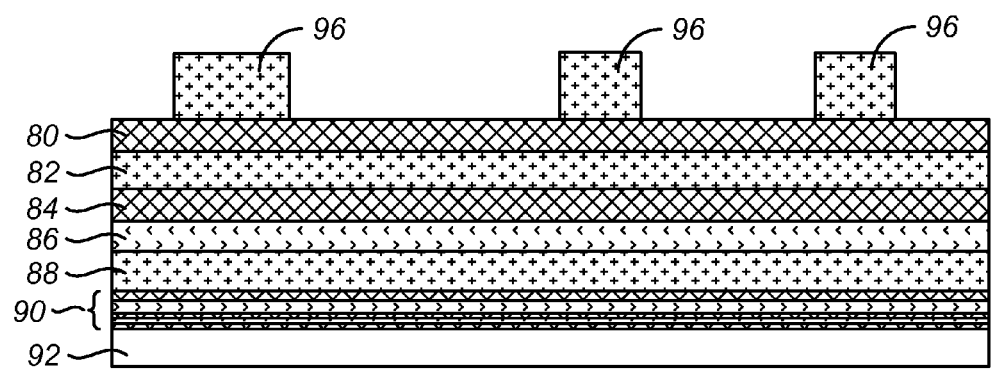
Figure 21:
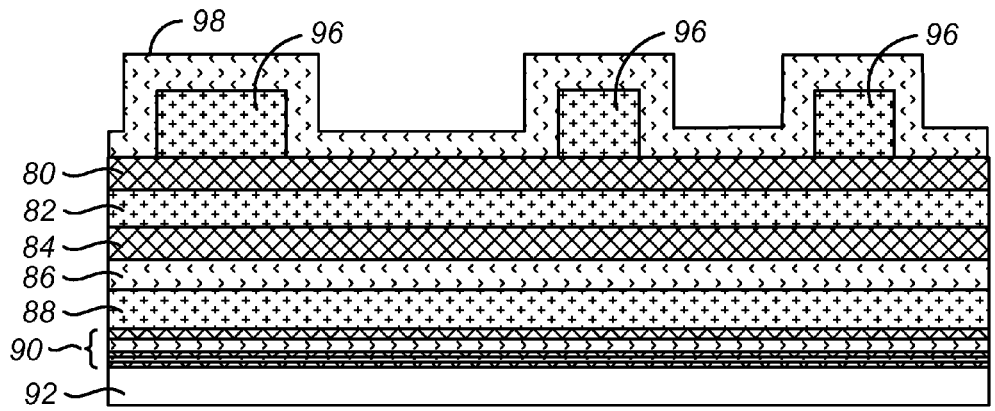
Figure 22:
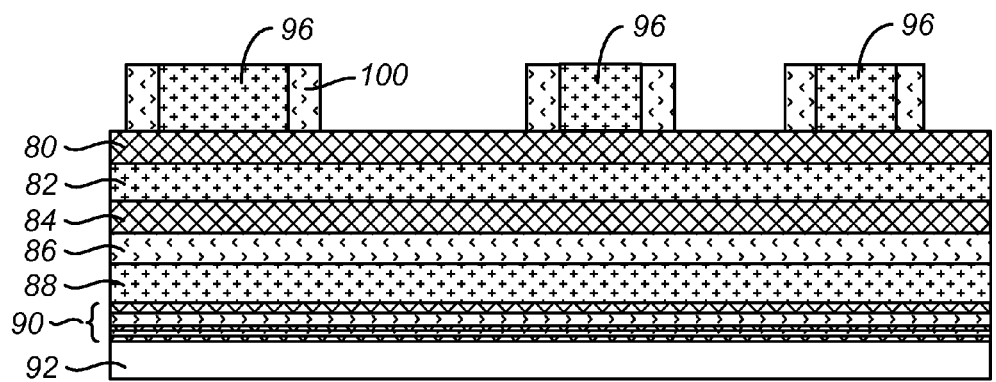
Figure 23:
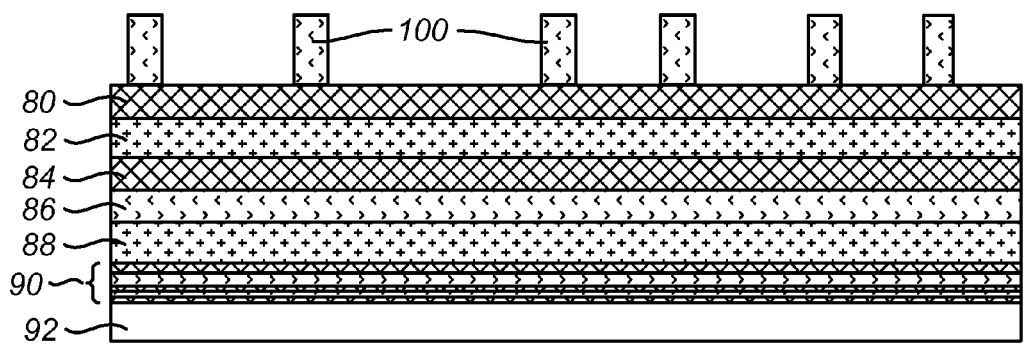
Figure 24:
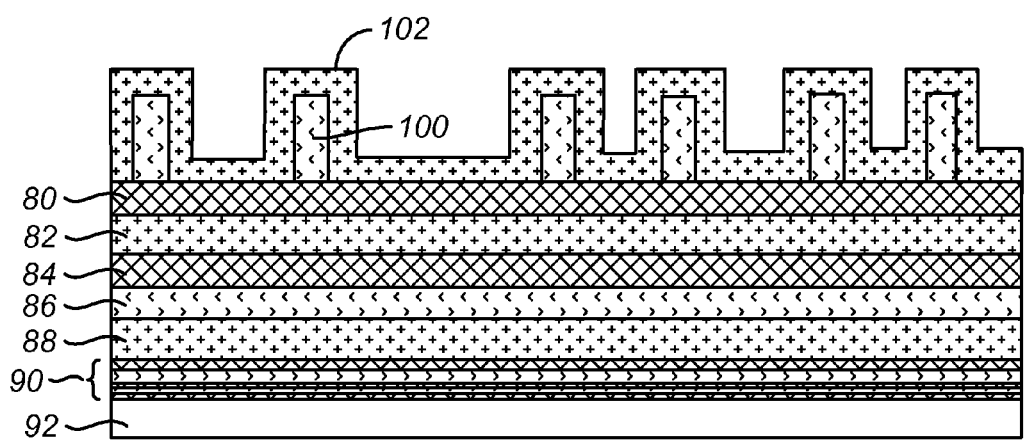
Figure 25:
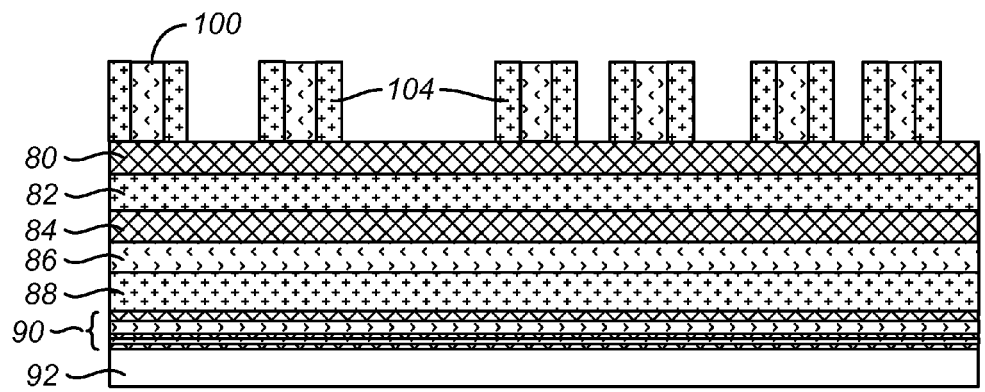

Photo resist trace 94 is used to etch first layer 78 to create structure 96, see FIG. 20, corresponding to the first line of material 12 of FIG. 1. FIG. 21 shows the results of depositing a layer 98 of SiN over the structure of FIG. 20. FIG. 22 shows the results of anisotropic etching the layer 98, which removes those portions of layer 98 covering structure 96 in addition to layer 80. Doing so leaves sidewall spacers 100 on each side of structure 96 with the sidewall spacers corresponding to spacers 32 of FIG. 2. FIG. 23 shows results of etching structure 96 leaving sidewall spacers 100. FIG. 24 shows the structure of FIG. 23 after a film 102 of poly has been deposited thereon. In FIG. 25 the portions of film 102 above sidewall spacers 100 and covering second layer 80 are removed leaving poly sidewall spacers 104 on each side of SiN sidewall spacers 100.

Figure 26:
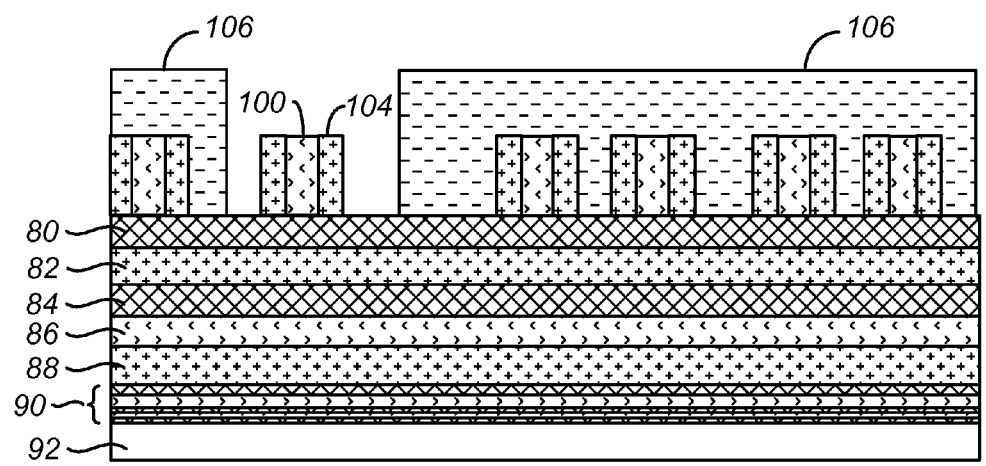
Figure 27:
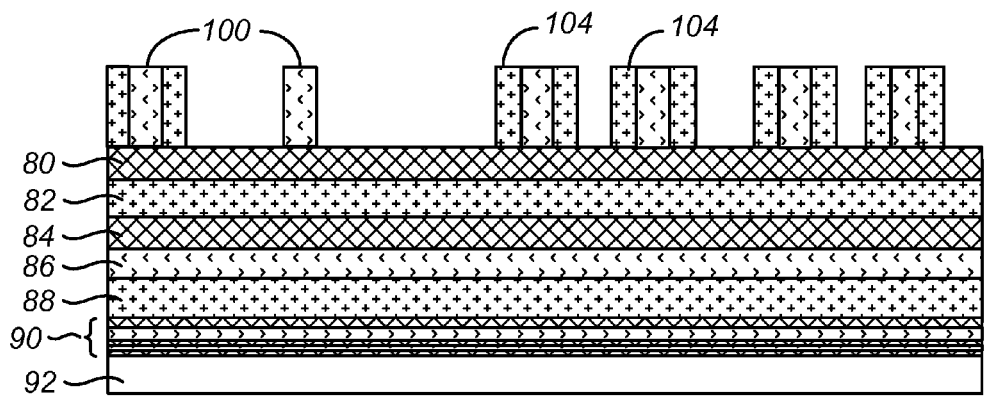
Figure 28:
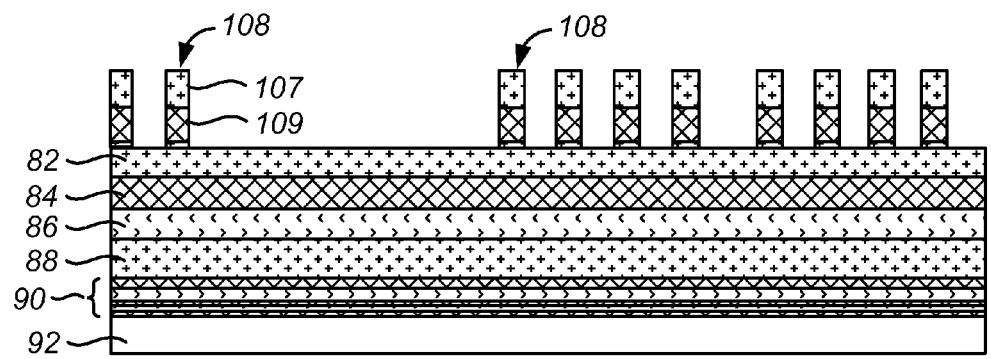

In FIG. 26 a photo resist mask 106 is used to cover portions of the structure of FIG. 25 that are not to be removed. Mask 106 can be considered to be the inverse of mask 36 of FIG. 4. FIG. 27 shows results of removing the poly sidewall spacers 104 not protected by photo resist mask 106 and the subsequent removal of photo resist mask 106. FIG. 28 shows the result of etching SiN sidewall spacers 100 and those portions of second layer 80 not covered by sidewall spacers 104; doing so leaves poly/$SiO_2$ stacks 108 on the third layer 82. Stacks 108 include upper, poly portions 107 and lower, $SiO_2$ portions 109. The comparing the two structures 96 on the right-hand side of the structure of FIG. 20 to the poly/$SiO_2$ stacks 108 on the right-hand side of the structure of FIG. 28, it can be seen that the number of vertical structures has quadrupled from 2 to 8.

Figure 29:
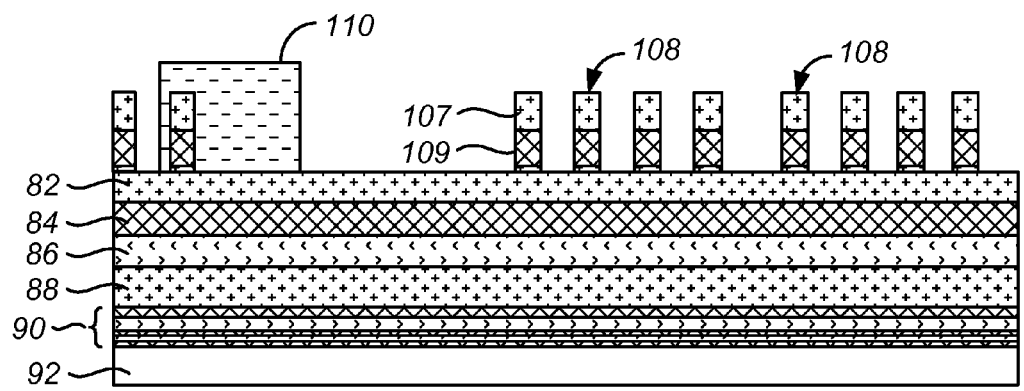
Figure 30:
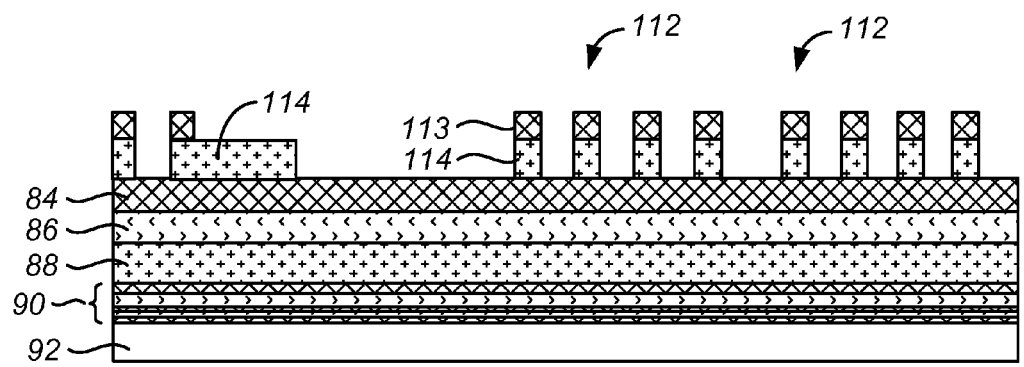
Figure 31:
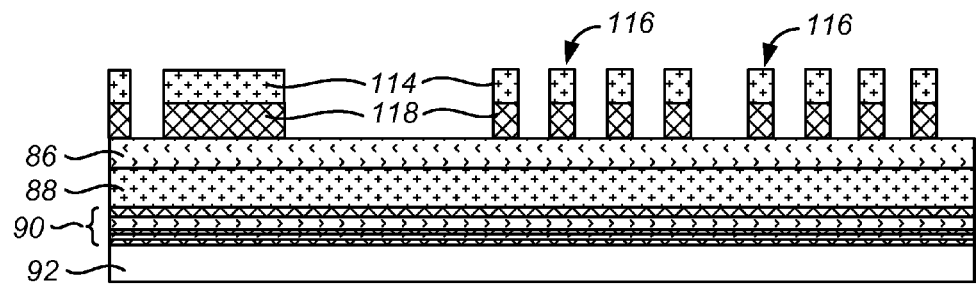

FIG. 29 shows a photo resist mask 110 on the structure of FIG. 28, mask 110 generally corresponding to mask 44 of FIG. 7. FIG. 30 shows the structure of FIG. 29 after those portions of third layer 82 not covered by stacks 108 or mask 110 have been etched. The upper, poly portions 107 are removed leaving stacks 112. Stacks 112 include an upper, $SiO_2$ portion 113 and a lower, poly portion 114. In FIG. 30, photo resist mask 110 has also been removed. FIG. 31 shows results of an oxide etch, which removes the upper, $SiO_2$ portions 113 and any portions of fourth, $SiO_2$ layer 84 not covered by poly portions 114, which creates stacks 116. Stacks 116 include poly portion 114 and $SiO_2$ portion 118.

Figure 32:
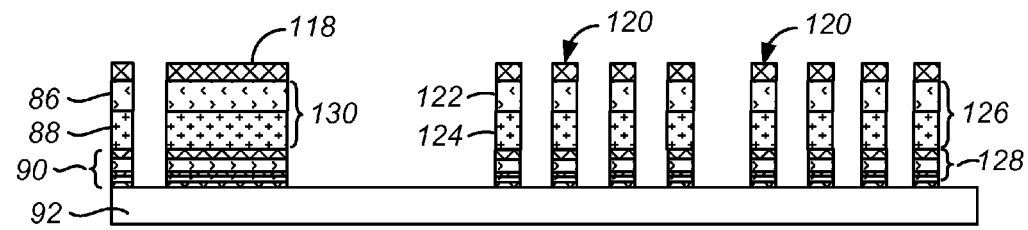

FIG. 32 shows results of etching of those portions of layers 86, 88 and 90 not covered by stacks 116, the removal of poly portion 114 and the partial removal of $SiO_2$ portion 118 leaving a row of memory cells 120 with etched elements 122, 124, typically of WSi and poly respectively, together constituting rows of word lines 126, word lines 126 located above charge storage regions 128. In this example, memory cells 120 form a NAND string. This will etching procedure also creates, in this example, a string select line 130 extending in the same direction as word lines 126. Part of $SiO_2$ portion 118 can remain after the entire seventh layer 90 is etched through because the thickness of fourth layers 84 is typically much greater than seventh layer 90.

Figure 33:
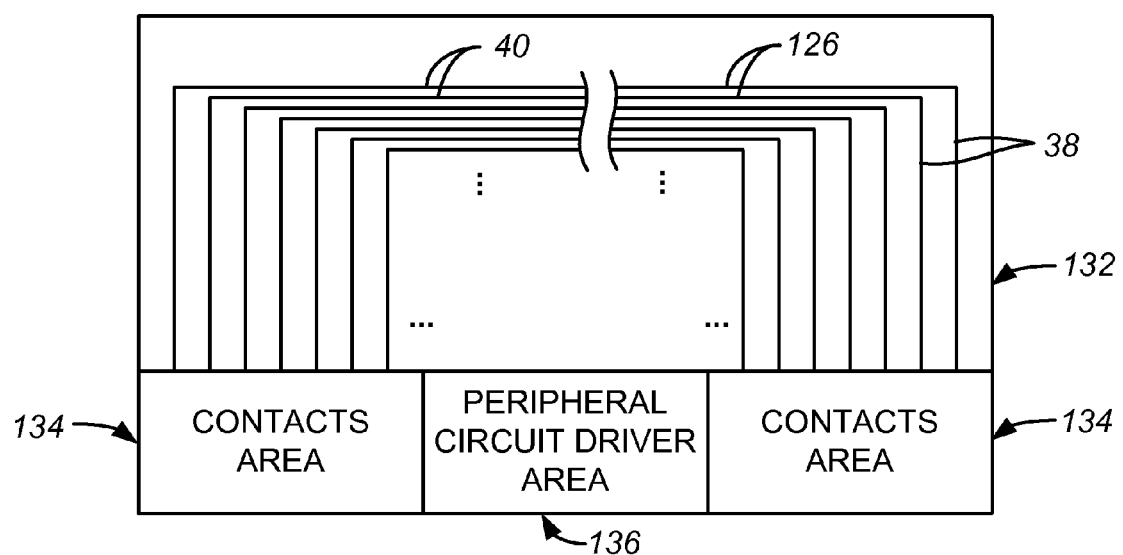
FIG. 33 is a block diagram schematically illustrating the relationship between the word lines region, the contacts areas and the peripheral circuit driver area.

FIG. 33 is a block diagram illustrating the closely spaced X directed word line portions 40 and the more widely spaced Y directed word line portions 38 in a word lines region 132. There would typically be thousands of word lines 126 in a typical memory circuit. In this example, two different contacts areas 134 are provided adjacent to and coupled to word lines region 132. The contacts 46 are located within contacts areas 134 along the more widely spaced (larger pitch) Y directed word line portions 38. A peripheral circuit driver area 136 is located between and coupled to contacts areas 134. This type of arrangement in which (1) the word lines are in a word lines region 132, (2) the word lines region 132 if one or more contacts areas 134 containing contacts 46 along Y directed word line portions 38, and (3) one or more associated peripheral circuit driver areas 136 contact areas 134, provides an efficient layout of integrated circuit real estate for high density memory.

Any and all patents, patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory comprising:
a first set of lines and a second set of lines, the first set of lines physically separated from the second set of lines, each of the first set of lines and each of the second set of lines having parallel X direction line portions in a first region and Y direction line portions in a second region, the second region offset from the first region;
the lengths of the X direction line portions being substantially longer than the lengths of the Y direction line portions;
the X direction and Y direction line portions having respective first and second pitches with the second pitch being at least 3 times larger than the first pitch;
the Y direction line portions and the X direction line portions defining a set of nested ring-like lines including outer lines substantially encircling inner lines; and
contact pickup areas at the Y direction line portions,
wherein the first set of lines is a mirror image relative to the second set of lines in both an X direction and a Y direction, and
wherein the first set of lines occupies a first range of the Y direction, the second set of lines occupies a second range of the Y direction, and the first range and the second range do not overlap.

2. The memory according to claim 1, wherein the nested ring-like parallel lines comprise first and second ring-like parallel lines with opposed U-shaped segments with gaps along at least some of the Y direction line portions.

3. The memory according to claim 2, wherein the gaps are positioned centrally along at least some of the Y direction line portions.

4. The memory according to claim 2, wherein the gaps are positioned centrally along each of the Y direction line portions.

5. The memory according to claim 1, wherein the lines comprise word lines or bit lines.

6. The memory according to claim 1, wherein the lines are formed lithographically and the first pitch has a sub lithographic dimension.

7. The memory according to claim 1, wherein:
the nested ring-like parallel lines comprise first and second ring-like parallel lines with opposed L-shaped segments with gaps along the Y direction line portions, the first and second ring-like parallel lines being adjacent to one another;
the X direction line portions have first and second ends;
the Y direction line portions for the first ring-like parallel line being at the first ends of the X-direction line portions; and
the Y direction line portions for the second ring-like parallel line being at the second ends of the X-direction line portions.

8. The memory according to claim 1, wherein the second pitch is at least 6 times the first pitch.

9. The memory according to claim 1, wherein the lines are formed lithographically and the contact pickup areas have lithographic dimensions.

10. An integrated circuit memory comprising:
a set of lines each having parallel X direction line portions in a first region and Y direction line portions in a second region, the second region offset from the first region;
the lengths of the X direction line portions being substantially longer than the lengths of the Y direction line portions;
the X direction and Y direction line portions having respective first and second pitches with the second pitch being at least 3 times larger than the first pitch;
the Y direction line portions and the X direction line portions defining a set of nested ring-like lines including outer lines substantially encircling inner lines; and
contact pickup areas at the Y direction line portions;
the nested ring-like parallel lines comprising first and second ring-like parallel lines with opposed L-shaped segments with gaps along the Y direction line portions, the first and second ring-like parallel lines being adjacent to one another;
the X direction line portions having first and second ends;
the first ring-like parallel line comprising first and second X direction line portions and first and second Y direction line portions, each X direction line portion having first and second ends, the first Y direction line portion being at the first end of the first X direction line portion, the second Y direction line portion being at the second end of the second X direction line portion; and
the second ring-like parallel line comprising third and fourth X direction line portions and third and fourth Y direction line portions, each of the third and fourth X direction line portions having first and second ends, the third Y direction line portion being at the second end of the third X direction line portion, the fourth Y direction line portion being at the first end of the fourth X direction line portion.

* * * * *